United States Patent
Sreekiran

(10) Patent No.: US 8,508,267 B1
(45) Date of Patent: Aug. 13, 2013

(54) LOOP FILTER FOR CURRENT-CONTROLLED-OSCILLATOR-BASED PHASE LOCKED LOOP

(75) Inventor: Samala Sreekiran, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 61 days.

(21) Appl. No.: 13/356,654

(22) Filed: Jan. 24, 2012

(51) Int. Cl.
    *H03L 7/06* (2006.01)
(52) U.S. Cl.
    USPC .......................................... 327/156; 327/147
(58) Field of Classification Search
    USPC .................................. 327/147, 156
    See application file for complete search history.

(56) References Cited

U.S. PATENT DOCUMENTS

| | | | | |
|---|---|---|---|---|
| 5,495,207 A * | 2/1996 | Novof | ............................ | 331/57 |
| 5,525,932 A * | 6/1996 | Kelkar et al. | .................. | 331/1 A |
| 5,629,650 A * | 5/1997 | Gersbach et al. | ............... | 331/17 |
| 5,651,037 A * | 7/1997 | Barrett et al. | .................. | 375/377 |
| 5,724,008 A * | 3/1998 | Ferraiolo et al. | ................. | 331/17 |
| 7,161,970 B2 * | 1/2007 | Lim et al. | ...................... | 375/130 |
| 7,203,149 B1 * | 4/2007 | Sano | ........................... | 369/59.11 |
| 7,880,554 B2 * | 2/2011 | Raghunathan et al. | ....... | 331/186 |
| 2005/0253632 A1 * | 11/2005 | Fahim | ............................ | 327/155 |
| 2006/0056491 A1 * | 3/2006 | Lim et al. | ...................... | 375/130 |
| 2006/0139105 A1 * | 6/2006 | Maxim et al. | ................... | 331/16 |
| 2010/0194471 A1 * | 8/2010 | Raghunathan et al. | ....... | 327/596 |
| 2012/0235718 A1 * | 9/2012 | Thakur et al. | ................. | 327/157 |

* cited by examiner

*Primary Examiner* — Adam Houston
(74) *Attorney, Agent, or Firm* — John R. Pessetto; W. James Brady; Frederick J. Telecky, Jr.

(57) ABSTRACT

A loop filter of a phase-locked loop (PLL) that uses a current-controlled oscillator (CCO) includes a capacitor, a voltage-to-current (V-to-I) converter, and a charge pump. The input node of the loop filter receives a first current from an external charge pump. The combination of the capacitor and the V-to-I converter generates a first component of the output current of the loop filter based on the first current. The charge pump of the loop filter generates a second component of the output current. The loop filter is implemented without the need for a zero-frequency-determining resistor, the resistor instead being realized by the product of the first current, the second component of the output current and the transconductance of the V-to-I converter. Phase noise reduction in the PLL, as well as implementation of the loop filter with a smaller area, are thus made possible.

11 Claims, 3 Drawing Sheets

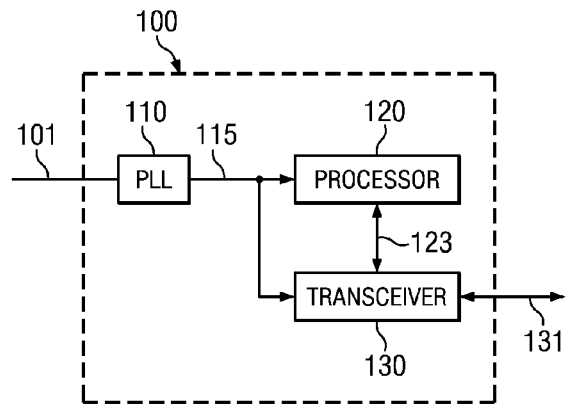
FIG. 1
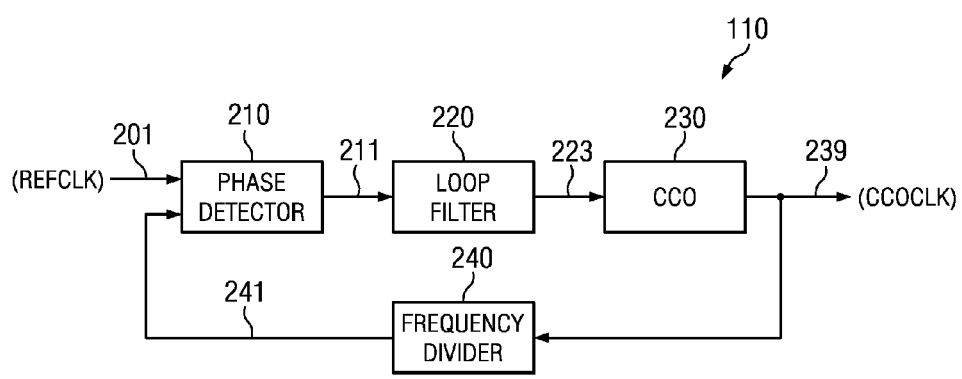
FIG. 2
| fin = 2MHz, fout = 500MHz | | | | | | | | | | |
|---|---|---|---|---|---|---|---|---|---|---|
| Icp1 | Icp2 | Cfilt | Rfilt | Czl | Cpl | gmvtoi-1 | gmvtoi-2 | Kico | M | BW (KHz) |
| 10uA | 62.5uA | 50pF | 200K | 50pF | 6pF | 125uS | 125uS | 4e12 | 250 | 150 |
FIG. 5

LOOP FILTER FOR CURRENT-CONTROLLED-OSCILLATOR-BASED PHASE LOCKED LOOP

BACKGROUND

1. Technical Field

Embodiments of the present disclosure relate generally to loop filters, and more specifically to loop filter for current-controlled-oscillator-based phase locked loop (PLL).

2. Related Art

Current-controlled oscillators are often used in phase-locked loops (PLL). The output frequency of a current-controlled oscillator is determined by the magnitude of a current provided as input to the current-controlled oscillator. For example, when a current-controlled oscillator is implemented as a gated-ring oscillator (GRO), the magnitude of the power-supply current to the inverters in the GRO can be used to set a desired output frequency of the GRO.

A loop filter of a PLL is used to perform low-pass filtering operation of the output of a phase detector used in the PLL. The low-pass filtered output of the loop filter is provided as input to control the frequency generated by the current-controlled oscillator. The design of the loop filter generally needs to support requirements such as small implementation area, low noise contribution, etc.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A loop-filter of a phase-locked loop (PLL) includes a capacitor, a voltage-to-current (V-to-I) converter and a charge pump. The capacitor is coupled between an input node of the loop-filter and a constant reference potential. Current generated by a charge pump external to the loop-filter generates a voltage at the input node. The voltage-to-current converter (V-to-I) circuit is coupled to receive the voltage at the input node, and to generate a first component of an output current at an output node of the loop-filter. The charge pump of the loop-filter generates a second component of the output current at the output node, the output current being the sum of the first component and the second component.

Several embodiments of the present disclosure are described below with reference to examples for illustration. It should be understood that numerous specific details, relationships, and methods are set forth to provide a full understanding of the embodiments. One skilled in the relevant art, however, will readily recognize that the techniques can be practiced without one or more of the specific details, or with other methods, etc.

BRIEF DESCRIPTION OF THE VIEWS OF DRAWINGS

Example embodiments will be described with reference to the accompanying drawings briefly described below.

FIG. 1 is a diagram of an example component in which several embodiments can be implemented.

FIG. 2 is a block diagram of a phase locked loop (PLL) in an embodiment.

FIG. 5 is a diagram showing a table containing the values of some parameters of a prior PLL.

The drawing in which an element first appears is indicated by the leftmost digit(s) in the corresponding reference number.

DETAILED DESCRIPTION

Figures 3A, 3B:
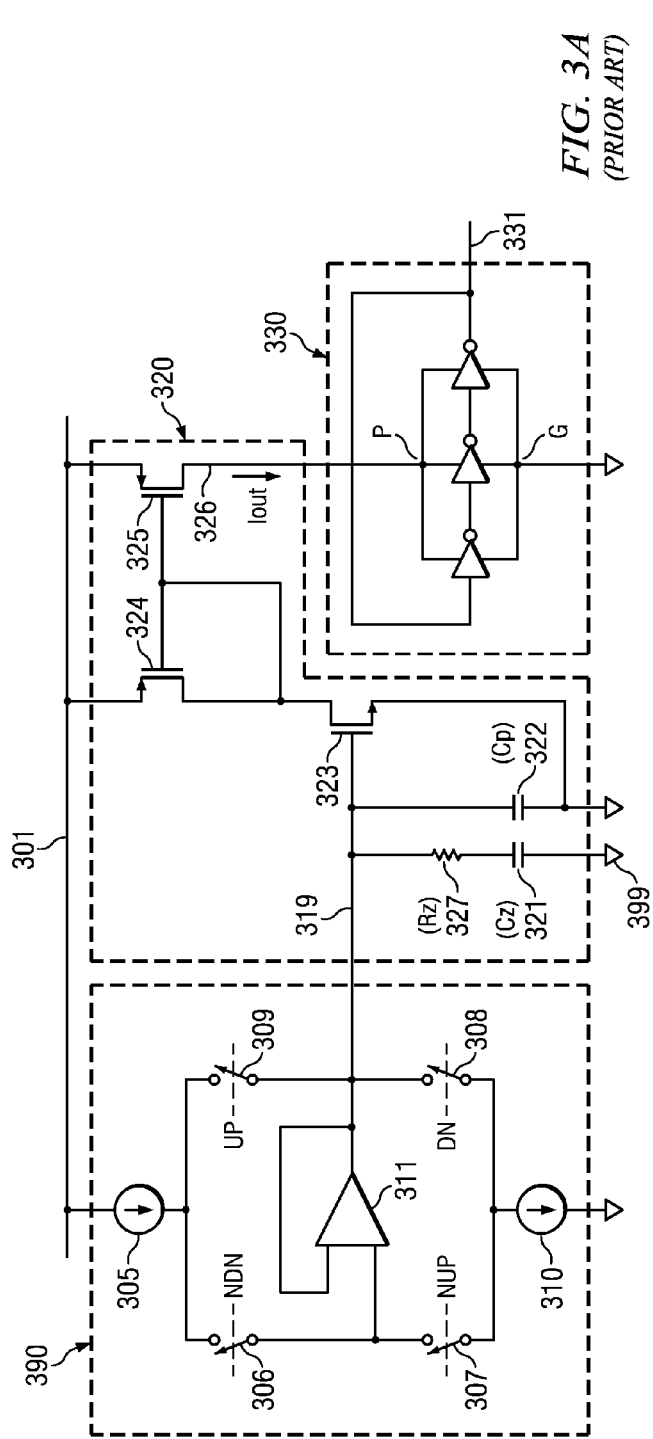
FIG. 3A is a diagram illustrating the implementation details of a prior loop filter used in a prior PLL designed to operate with a current-controlled oscillator.
FIG. 3B is a diagram showing a table containing the values of some parameters of a prior PLL.

Various embodiments are described below with several examples for illustration.

1. Example Component

FIG. 1 is a diagram of an example component in which several embodiments can be implemented. The diagram shows integrated circuit (IC) 100 containing phase locked loop (PLL) 110, processor 120 and transceiver 130. The specific blocks of IC 100 are shown merely by way of illustration, and typical implementations of IC 100 may contain more or fewer blocks.

Processor 120 receives a clock on path 115. The operations of processor 120 may be synchronized with respect to clock 115. Processor 120 may generate data to be processed by transceiver 130, and provide the data to transceiver 130 on (bidirectional) path 123. Processor 120 may receive data from transceiver 130 also on path 123. In general, processor 120 operates to provide various features designed to be provided by a system or device containing IC 100. When implemented in a wireless communications device, for example, processor 120 may perform corresponding baseband processing operations.

Transceiver 130 may perform several operations required to transmit modulated signals on, and receive modulated signals from, path 131. Accordingly, transceiver 130 may receive data from processor 120, modulate a carrier with the data, and transmit the modulated signal on path 131. Path 131 may be connected to an external antenna, which may then transmit the modulated signal on a wireless medium. Transceiver 120 may receive a modulated signal on path 131 (e.g., from a receive antenna), demodulate the signal, and forward the data obtained from the demodulation to processor 120. Transceiver 130 receives clock 115, and may generate various internal clocks derived from clock 115.

PLL 110 receives a reference clock 101, for example from an external source, and operates to lock (align the phase and/or frequency of) output clock 115 with respect to (the phase and frequency of) reference clock 101.

FIG. 2 is a block diagram of PLL 110 in an embodiment. PLL 110 is shown containing phase detector 210, loop filter 220, current-controlled oscillator (CCO) 230 and frequency divider 240. REFCLK 201 and CCOCLK 239 respectively represent a reference clock provided to PLL 110 and an output clock of PLL 110. Paths 201 and 239 of FIG. 2 correspond respectively to paths 101 and 115 of FIG. 1.

Phase detector (PD) 210 receives REFCLK 201 (for example, from an external source, not shown) and feedback clock 241, and generates an error signal representative of the phase error between the two clocks. PD 210 may internally contain a charge pump. PD 210 provides the error signal on path 211.

Loop filter 220 performs low-pass filtering of the error signal received on path 211, and generates a filtered signal on path 223. Loop filter 220 contains a voltage-to-current (V-to- I) converter to convert the filtered error signal voltage into a current, provided on path 223. Filtered signal 223 is a current, and controls the frequency of CCOCLK (239) generated by CCO 230. CCOCLK represents the output signal of PLL 110. Frequency divider 240 divides the frequency of CCOCLK by a desired value (represented by a number M), and generates a lower-frequency clock (feedback clock) on path 241.

FIG. 3A is a diagram illustrating a prior implementation of a loop filter used in a prior PLL that uses a current-controlled oscillator. In addition to the prior loop filter 320, a current-controlled oscillator CCO 330 and charge pump 390 are also shown in FIG. 3A. Terminals 301 and 399 respectively represent power supply and ground terminals.

Charge pump 390 contains current sources 305 and 310, operational amplifier (OPAMP) 311, and switches 306, 307, 308 and 309. Switches 306, 307, 308 and 309 may each be implemented using a transistor (e.g., MOS transistor), and are opened or closed based on the logic levels of respective binary signals NDN, NUP, DN and UP. Signals UP and DN are generated by a phase detector (not shown) driving charge pump 390. Signals NUP and NDN are the logical inverse of UP and DN respectively. The difference in the widths (e.g., logic high duration) of signals UP and DN is representative of the phase error between the reference clock and the output clock of the PLL. OPAMP 311 is used for ensuring proper biasing of current sources 305 and 310 (which may each be implemented using one or more transistors) when both UP and DN signals are OFF. The current generated by each of charge pumps 305 and 310 is denoted by Icp.

CCO 330 is shown implemented as a ring oscillator. The power supply terminals of the inverters of CCO 330 are denoted in FIG. 3A as 'P', which is connected to output (326) of loop filter 320. Signal 331 represents an output clock generated by the prior PLL, and corresponds to CCOCLK 239 of FIG. 2.

Loop filter 320 is shown containing resistor 327 (Rz), capacitors 321 (Cz) and 322 (Cp), and a voltage-to-current (V-to-I) converter formed by transistors 323, 324 and 325. Charge pump 390 operates to either source a current (Icp) into loop filter 320 (via path 319), or sink a current Icp from loop filter 320 (via path 319). Resistor 327 and capacitors 321 and 322 operate to low-pass filter the voltage at node/path 319. Transistors 324 and 325 form a current-mirror pair. The V-to-I converter converts the filtered voltage on path 319 to a current Iout provided on path 326, with Iout being determined by the transconductance (gmvtoi) of the V-to-I converter. The transconductance gmvtoi equals the transconductance of transistor 323 scaled by the mirroring ratio of current mirror pair formed by transistors 324 & 325. With a mirroring ratio of one, transconductance of the V-to-I converter equals the transconductance of transistor 323. Rz and Cz determine the zero of the transfer function of prior loop-filter 320.

The closed-loop transfer function H(s) of the prior PLL, with charge pump, loop-filter and current-controlled oscillator as shown in FIG. 3A, is specified by the following equation:

$$H(s) = \frac{1}{M} \frac{Icp * gmvtoi * (1 + sRzCz)}{s(Cz + Cp)\left[1 + sRz\frac{Cp*Cz}{Cp+Cz}\right]} \frac{Kico}{s} \quad \text{Equation 1}$$

wherein,

M is the divide ratio of a frequency divider (similar to frequency divider 240) used in the prior PLL, gmvtoi is the transconductance of the V-to-I converter, Kico is the transfer function (gain) of CCO 330, and s is the Laplace variable.

The bandwidth (BW) of the prior PLL is specified by the following equation:

$$BW = \frac{Icp * gmvtoi * Rz * Kico}{M} \quad \text{Equation 2}$$

The current contribution (Iz) in Iout (path 326) due to the effect of the series RC circuit formed by Rz and Cz (and ignoring the effect of Cp) is specified by the following equation:

$$Iz=[(Icp*Rz)+(Icp/sCz)]*gmvtoi*(\theta_e/2\pi) \quad \text{Equation 3A}$$

wherein $\theta_e$ is the phase error between the phases REFCLK 201 and feedback clock 241. The terms of Equation 3A can be re-arranged to provide the following equation:

$$Iz=Icp/sCz*gmvtoi*[1+s*(Rz*Cz)]*(\theta_e/2\pi) \quad \text{Equation 3B}$$

One drawback with the prior loop filter is that, at least for some operating scenarios, the values of Cz and Rz turn out to be unacceptably high. An example scenario with corresponding values of some of the parameters noted above is illustrated with respect to the table shown in FIG. 3B. As shown there, the prior PLL is to generate an output clock (331) with frequency of 500 MHz (fout) from a reference clock (not shown, but similar to REFCLK of FIG. 2) of frequency 2 MHz (fin). The value of M is therefore 250. For ensuring stability of the closed-loop, the bandwidth is set to 150 KHz.

Transconductance gmvtoi (of Equation 2) is fixed by the control voltage range available at the output of charge pump 390 and the current required by CCO 330 to generate the required output frequency on path 331. Kico (of Equation 2) is usually fixed based on the range of output frequencies required and the current that is generated by transconductance gmvtoi. Also, an upper limit for Kico is usually set by implementation area consideration of CCO 330. Icp is usually constrained by acceptable magnitude of leakage-dependent spur in the spectrum of signal 331. Hence, to obtain the desired loop BW of 150 KHz, the value of Rz (resistance of resistor 327) turns out to be 10K (kilo ohms). The value of Cz (capacitance of capacitor 321) turns out to be 250 pF (pico Farads).

A large value of Rz (such as 10K of the example) generally results in a relatively larger phase noise (also known as jitter) in signal 331. Reduction in the value of Rz reduces the BW of the prior PLL correspondingly. A large value of Cz (such as 250 pF of the example) may translate to a relatively large implementation area for capacitor 321. At least for the above reasons, the prior loop-filter design may not be acceptable.

2. Loop-Filter

Figure 4:
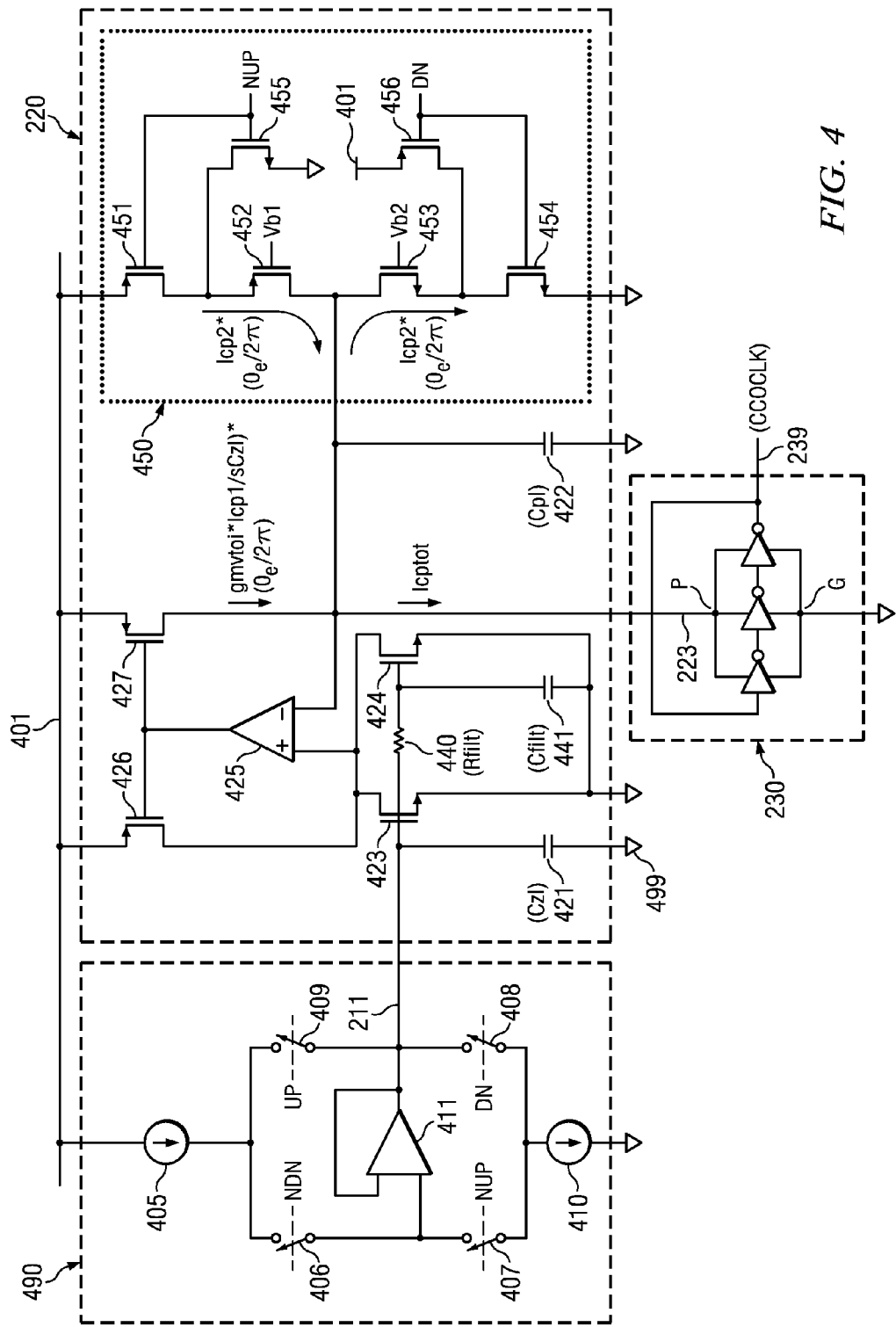
FIG. 4 is a diagram illustrating the implementation details of a loop-filter used in PLL, in an embodiment

FIG. 4 is a diagram illustrating the implementation details of a loop-filter (220) used in PLL 110, in an embodiment. Also shown are charge pump 490 (first charge pump) and current-controlled oscillator (CCO) 230. For conciseness, frequency divider 240 and phase detector 210 are not shown in FIG. 4. Charge pump 490 is implemented identical to charge pump 390 of FIG. 3A, with current sources 305 and 310, operational amplifier (OPAMP) 311, and switches 306, 307, 308 and 309 corresponding respectively to current sources 405 and 410, operational amplifier (OPAMP) 411, and switches 406, 407, 408 and 409. Signals NDN, NUP, DN and UP shown in FIG. 4 are the same as the identically-named signals in FIG. 3A. Each of current sources 405 and 410 generates a current Icp1 (first current). Charge pump 490 may be contained within phase detector 210 shown in FIG. 2. CCO 230 is implemented similar to CCO 330 of FIG. 3A. Although shown as containing only three inverters, the specific number of inverters in actual implementation may be different. Terminals 401 and 499 respectively represent power supply and ground terminals.

Loop-filter 220 is shown containing capacitors 421 (Czl) (first capacitor), 441 (Cfilt) and 422 (Cpl), resistor 440 (Rfilt), transistors 423, 424, 426 and 427, OPAMP 425 and charge pump 450 (second charge pump). The combination of transistors 423, 424, 426 and 427 and OPAMP 425 implements a V-to-I converter. The V-to-I converter formed by transistors 423, 424, 426 and 427 and OPAMP 425 generates a current of magnitude [(gmvtoi*Icp1/sCzl)*($\theta_e$/2$\pi$)] on path 223. The current [(gmvtoi*Icp1/sCzl)*($\theta_e$/2$\pi$)] is referred to herein as the 'first component'. $\theta_e$ is the phase error between REFCLK 201 and feedback clock 241. Transistors 423, 424, 453 and 454 and 455 are N-type metal oxide semiconductor (MOS) field effect transistors (NMOS). Transistors 426, 427, 451, 452 and 456 are P-type metal oxide semiconductor field effect transistors (PMOS).

OPAMP 425 equates the drain voltages of the current mirror pair formed by transistors 426 & 427, thereby ensuring good power supply rejection, which is critical for PLLs implemented in SOC (system on chip) environment in which power supply noise tends to be large. OPAMP 425, in combination with current mirror pair 426 and 427, forms what is termed as an 'active cascode'. As can be observed from FIG. 4, the drain of transistor 423 is connected to a 'first terminal' of the active cascode. Terminal 223 may be viewed as a 'second terminal' of the active cascode. One terminal of resistor 440 (Rfilt) is connected to node 211, the other terminal of resistor 440 being connected to the gate terminal of transistor 424. Capacitor 441 (Cfilt) is connected across the gate terminal of transistor 424 and ground. The signal on node 211 is low-pass-filtered by the RC filter formed by resistor 440 and capacitor 441, and the low-pass filtered signal is provided as input to the gate of transistor 424.

Charge pump 450 is shown implemented using transistors 451, 452, 453, 454, 455 and 456. The gate terminals of transistors 455 and 456 respectively receive signals NUP and DN. The operation of charge pump is synchronized with and is identical to that of charge pump 490, i.e., in all time intervals in which charge pump 490 drives a current Icp1 (first current) into loop filter 220 (via path 211, which is the input node of loop-filter 220), charge pump 450 drives a current [Icp2*($\theta_e$/2$\pi$)] into node 223. Similarly, in all time intervals in which charge pump 490 draws a current Icp1 (first current) from loop filter 220 (via path 211), charge pump 450 draws a current [Icp2*($\theta_e$/2$\pi$)] from node 223. The 'polarity' of currents Icp1 and Icp2 are therefore the same in all time intervals. In other embodiments, charge pump 450 may be implemented identical to charge pump 490.

Charge pump 450, thus generates a "second component" of the current generated on output node (or path) 223. The total current (Icptot, also referred to herein as the output current) on path 223 (output node) is the sum of current [(gmvtoi*Icp1/sCzl)*($\theta_e$/2$\pi$)] and [Icp2*($\theta_e$/2$\pi$)]. Transistors 452 and 453 receive biasing voltages vb1 and vb2 on their respective gate terminals, and operate as current sources. The other transistors of charge pump 450 operate under the control of corresponding signals NUP and DN to either switch ON or switch OFF current sources 452 and 453.

The use of charge pump 450 to source or to sink from node 223 an additional current Icp2 enables the realization of loop-filter 220 without the need for a zero-determining resistor (corresponding to Rz of FIG. 3A). In addition, the loop-filter design of FIG. 4 enables Czl to be designed with a relatively smaller value (compared with Cz of FIG. 3A), thereby reducing implementation area. The following description illustrates these benefits obtained. For comparison, the description below assumes the same requirements as in the example of FIG. 3B, i.e., fin of 2 MHz and fout of 500 MHz, with a BW of 150 KHz.

The closed-loop transfer function H(s) of PLL 110 (of FIG. 2) implemented with loop-filter 220 as shown in FIG. 4 is specified approximately by the following equation:

$$H(s) \approx \frac{1}{M} \frac{I_{cp1} gm_{vtoi1} \left(1 + s \frac{I_{cp2}}{I_{cp1}} \frac{C_{z1} + C_{filt}}{gm_{vtoi1}}\right)}{s(C_{z1} + C_{filt})(1 + sR_{ico}C_p)} \frac{K_{ico}}{s} \qquad \text{Equation 4}$$

wherein,
Icp1 is the current generated by either of sources 405 and 410,
Icp2 is the current generated by charge pump 450,
gmvtoi1 is the gain (transconductance) of transistor 423,
Czl is the capacitance of capacitor 421,
Cfilt is the capacitance of capacitor 441,
Kico is the gain of CCO 230,
s is the complex Laplace variable,
Rico is the input impedance of CCO 230,
Cp is the capacitance of capacitor 422, and
M is the divide ratio of frequency divider 240.

The bandwidth (BW) of PLL 110 is specified by the following equation:

$$BW = \frac{I_{cp2} K_{ico}}{M} \qquad \text{Equation 5}$$

wherein, the terms Icp2, Kico and M are as defined above with respect to Equation 5.

Assuming that Rfilt, Cfilt and transistor 424 were not implemented in the circuit of FIG. 4, and that the transconductance of transistor 423 equals gmvtoi (i.e., same as that of transistor 323 of FIG. 3A), the current contribution (Izl) to output current Icptot (on path 223) due to the operation of charge pump 490 and the V-to-I conversion equals (Icp1/sCzl*gmvtoi). Charge pump 450 contributes a current equal to Icp2, which is independent of Cz and the V-to-I converter. Hence, the total current contribution (Izltot) to output current Icptot ignoring the effect of Cpl is specified by the following equation:

Izltot=((Icp1/sCzl*gmvtoi)+Icp2)*($\theta_e$/2$\pi$)      Equation 6A wherein Icp1 is the current generated by each of current sources 405 and 410.

Re-arranging the terms of Equation 6A provides the following equation:

Izltot=Icp1/sCzl*gmvtoi*[1+ s*(Icp2/(Icp1*gmvtoi))*Czl]*($\theta_e$/2$\pi$)      Equation 6B Comparing Equations 6B and 3B, it may be observed that Rz of the prior loop-filter is realized in the loop-filter of FIG. 4 by the term (Icp2/(Icp1*gmvtoi)). The values Icp2 and Icp1 can be chosen suitably to realize a desired value equal to Rz of the prior loop-filter. Since there is no (physical) resistor (equivalent to Rz of the prior loop-filter) in the loop filter of FIG. 4, phase noise (jitter) in the frequency spectrum of CCOCLK 239 (output clock of PLL 110) is reduced. The quantities Icp2, Icp1, gmvtoi and Czl also determine the zero of the transfer function of loop-filter 220. The exact expression for the zero frequency (fz) of loop-filter 220 is provided by the equation below:

$$f_z = \frac{gm_{vtoi1}}{2\pi \frac{I_{cp2}}{I_{cp1}}(C_{zl} + C_{filt})} \qquad \text{Equation 6C}$$

The ratio (Icp2/Icp1) can be seen as a 'scaling factor' (capacitance multiplication factor) for Czl. By increasing the ratio (Icp2/Icp1), the value of Czl may be correspondingly reduced for a same zero frequency of loop filter 220. Thus, implementation area for capacitor 421 can be reduced. The table shown in FIG. 6 lists various component/parameter values for PLL 110 implemented using loop-filter 220, with the requirements of fin of 2 MHz and Fout of 500 MHz being the same as that considered for the prior PLL to facilitate comparison.

Since, the term [(Icp2/(Icp1*gmvtoi))] equals the prior Rz, maximum scaling down of Czl is possible when the value of gmvtoi equals Rz. Comparing the tables of FIG. 3B and FIG. 6, this would require gmvtoi to equal 100 uS (micro siemens) for the same value of the zero frequency. By comparison, gmvtoi of the prior loop-filter is 250 uS. A gmvtoi of 100 uS would require using a transistor with a channel width correspondingly less compared to that of transistor 323 of the prior loop-filter. To avoid such a requirement, in embodiments of the present disclosure, to achieve an effective reduced transconductance gmvtoi, two transistors 423 and 424 are used, with interconnections as shown in FIG. 4.

The respective transconductances gmvtoi1 and gmvtoi2 of transistors 423 and 424 are designed to equal 125 uS each. Thus, from a DC standpoint the transconductance of the V-to-I converter of FIG. 4 is maintained at 250 uS (being the sum of the gmvtoi1 and gmvtoi2). The RC filter formed by resistor 440 (Rfilt) and capacitor 441 (Cfilt) low-pass filters the signal at node 211, and a low-pass filtered signal is fed to the gate terminal of transistor 424. The values for Rfilt and Cfilt are selected such that from an AC perspective the effective transconductance of the V-to-I converter of loop-filter 220 is approximately 125 uS, thereby reducing the effect of the otherwise large transconductance (of 250 uS) in determining the zero of loop-filter 220. It is noted, however, that in other embodiments Rfilt, Cfilt and transistor 424 may not be implemented, with transistor 423 being implemented to have the desired transconductance (100 uS in the example).

From Equation 5, variation in the BW of PLL 110 can be caused only due to variations in Icp2 and Kicol, M being a fixed number. Kicol does not vary much with variations in PVT (process, operating voltage and operating temperature). Variation in BW due to Icp2 can be made small by using accurate (trimmed) current sources (transistors 452 and 453) in charge pump 450.

Loop-filter 220 (and therefore PLL 110) may therefore be implemented with relatively smaller area and lower noise, and with a BW that is relatively stable.

While in the illustrations of FIGS. 1, 2 and 4, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals. In the instant application, power supply and ground terminals are referred to as constant reference potentials.

It should be appreciated that the specific type of transistors (such as NMOS, PMOS, etc.) noted above with respect to FIG. 4 are merely by way of illustration. However, alternative embodiments using different configurations and other types of transistors, such as bipolar junction transistors (BJT) or a combination of MOS and BJT, will be apparent to one skilled in the relevant arts by reading the disclosure provided herein. For example, NMOS transistors and PMOS transistors may be swapped, while also interchanging the connections to power and ground terminals. Accordingly, in the instant application, the source (emitter) and drain (collector) terminals (through which a current path is provided when turned ON and an open path is provided when turned OFF) of transistors are termed as current terminals, and the gate (base) terminal is termed as a control terminal.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A loop filter of a phase-locked loop (PLL), the loop filter comprising:
    a first capacitor coupled between an input node of the loop filter and a constant reference potential, the first capacitor to receive a first current generated by a first charge pump external to the loop filter, the first current generating a first voltage at the input node;
    a voltage-to-current converter (V-to-I) circuit coupled to receive the first voltage and to generate a first component of an output current at an output node of the loop filter;
    a second charge pump to generate a second component of the output current at the output node, wherein the output current is the sum of the first component and the second component.

2. The loop filter of claim 1, wherein a zero frequency of a transfer function of the loop filter is determined by each of a capacitance of the first capacitor, a ratio of the second component of the output current and the first current, and a transconductance of the V-to-I converter,
    wherein the ratio of the second component of the output current and the product of the first current and the transconductance represents a resistance, the resistance and the capacitance together determining the zero frequency.

3. The loop filter of claim 2, wherein the second charge pump generates the second component of the output current with a same polarity as the first current in all time intervals.

4. The loop filter of claim 1, wherein the V-to-I circuit comprises:
    a first transistor, wherein a control terminal of the first transistor is coupled to the input node, wherein a first current terminal of the first transistor is coupled to the constant reference potential;
    an active cascode circuit, wherein a first terminal of the active cascode circuit is coupled to a second current terminal of the first transistor, wherein a second terminal of the active cascode circuit is the output terminal.

5. The loop filter of claim 4, further comprising:
    a second transistor; and
    a low-pass filter,
    wherein a control terminal of the second transistor is coupled to the input node via the low-pass filter, a first current terminal of the second transistor is coupled to the constant reference potential, and a second current terminal of the second transistor is coupled to the second current terminal of the first transistor.

6. The loop filter of claim 5, further comprising a second capacitor, wherein the second capacitor is coupled between the output node and the constant reference potential.

7. A phase locked loop (PLL) comprising:
a phase detector to receive a reference clock and a feedback clock as inputs, and to generate an error signal proportional to a phase difference between the reference clock and the feedback clock;
a loop filter to generate an output current by low-pass filtering the error signal;
a current controlled oscillator (CCO) to generate an output clock with a frequency proportional to the output current; and
a frequency divider to generate the feedback clock from the output clock,
wherein the loop filter comprises:
a first capacitor coupled between an input node of the loop filter and a first constant reference potential, the first capacitor to receive the error signal, the error signal generating a first voltage at the input node;
a voltage-to-current converter (V-to-I) circuit coupled to receive the first voltage and to generate a first component of the output current;
a first charge pump to generate a second component of the output current, wherein the output current is the sum of the first component and the second component, wherein the output current is provided at an output node of the loop filter.

8. The PLL of claim 7, wherein the V-to-I circuit comprises:
an operational amplifier (OPAMP);
a first N-type MOS transistor (NMOS) transistor, wherein a control terminal of the first NMOS transistor is coupled to the input node, wherein a first current terminal of the first NMOS transistor is coupled to the first constant reference potential; and
a current mirror pair comprising a first P-type MOS (PMOS) transistor and a second PMOS transistor, wherein a control terminal of each of the first PMOS transistor and the second PMOS transistor is coupled to an output terminal of the OPAMP, wherein a first current terminal of each of the first PMOS transistor and the second PMOS transistor is coupled to a second constant reference potential, wherein a second current terminal of the first PMOS transistor is coupled to a second current terminal of the first NMOS transistor, wherein a first input terminal of the OPAMP is coupled to the second current terminal of the first NMOS transistor, and wherein a second current terminal of the second PMOS transistor is coupled to each of a second input terminal of the OPAMP and the output node.

9. The PLL of claim 8, wherein the V-to-I circuit further comprises:
a second NMOS transistor, wherein a control terminal of the second NMOS transistor is coupled to the input node via a resistor, wherein a first current terminal of the second NMOS transistor is coupled to the first constant reference potential, wherein a second current terminal of the second NMOS transistor is coupled to the second current terminal of the first NMOS transistor, and wherein a capacitor is coupled between the control terminal of the second NMOS transistor and the first constant reference potential.

10. The PLL of claim 9, wherein the error signal is a first current, wherein the first charge pump generates the second component of the output current with a same polarity as the first current in all time intervals.

11. The PLL of claim 7, wherein the PLL is comprised in an integrated circuit (IC).

* * * * *